United States Patent [19]

Chen

[11] Patent Number: 6,080,634

[45] Date of Patent: Jun. 27, 2000

[54] METHOD OF MENDING AND TESTING SEMICONDUCTOR APPARATUS

[75] Inventor: Yang Chen, Taipei Hsien, Taiwan

[73] Assignee: United Microelectronics Corp., Hsin-Chu, Taiwan

[21] Appl. No.: 09/009,507

[22] Filed: Jan. 20, 1998

[30] Foreign Application Priority Data

Nov. 8, 1997 [TW] Taiwan .................................. 86116670

[51] Int. Cl.[7] ................................................. H01L 71/76
[52] U.S. Cl. ......................... 438/401; 438/462; 438/975
[58] Field of Search ............................... 438/4, 462, 975, 438/FOR 435, 407; 356/401; 357/797

[56] References Cited

U.S. PATENT DOCUMENTS

| | | | |
|---|---|---|---|
| 5,294,975 | 3/1994 | Norman et al. | 356/401 |
| 5,414,519 | 5/1995 | Han | 356/401 |
| 5,500,736 | 3/1996 | Koitabashi et al. | 356/401 |
| 5,528,372 | 6/1996 | Kawashima | 356/401 |
| 5,627,083 | 5/1997 | Tounai | 438/975 |
| 5,696,587 | 12/1997 | Yung | 356/401 |
| 5,760,484 | 6/1998 | Lee et al. | 257/797 |
| 5,777,392 | 7/1998 | Fujii | 257/797 |

*Primary Examiner*—Kevin M. Picardat
*Attorney, Agent, or Firm*—Rabin & Champagne, P.C.

[57] ABSTRACT

A method of mending and testing a semiconductor apparatus. Only one L-shaped laser target or one set of targets forming a T-shaped target is in use. By choosing a primary laser target on the device with a damaged circuit, and a reference laser target on a device peripheral to the device with the damaged circuit, the laser mending machine is fed with the data of the coordinates of the primary and reference targets. The positions of these targets are scanned and calculated by the laser mending machine. With the feeding of the relative coordinates of these targets into the laser mending machine, the position to be mended, that is, the position with a damaged circuit, is obtained correctly. The fuse in the damaged circuit is then blown, and the circuit replaced by a new circuit with the same function.

27 Claims, 4 Drawing Sheets

METHOD OF MENDING AND TESTING SEMICONDUCTOR APPARATUS

CROSS-REFERENCE TO RELATED APPLICATION

This application claims priority benefit of Taiwan application Serial no. 86116670, filed Nov. 8, 1997, the full disclosure of which is incorporated herein by reference.

BACKGROUND OF THE INVENTION

1. Field of the Invention

The invention relates to a mending and test method, and more particularly to a method of mending and testing a semiconductor apparatus.

2. Description of the Related Art

Due to the very small dimensions, conventional memory products, such as static random access memories (SRAM) and a dynamic random access memories (DRAM), do not always operate normally. To avoid this, a laser mending machine is used to scan two L-shaped or T-shaped laser targets on the devices. The damaged circuits are then found and mended.

As process techniques grow more and more advanced, the dimension of devices becomes smaller and smaller. As the laser target further shrinks, or the circuit is designed too close to the laser target, the laser mending machine can not correctly recognize the circuit to be mended, and therefore, the mending efficiency and the yield of devices is degraded.

A rectangular diagram of a mending and testing method using an L-shaped laser target, and the L-shaped laser target are shown in FIG 1a and FIG. 1b.

Referring to FIG. 1a, on a wafer, the device 10 to be mended is found. Two L-shaped laser targets (12 and 14) are formed on the device 10. Referring to FIG. 1b, an enlarged view of the L-shaped laser target 12 is shown. On the L-shaped laser target 12, there are an X-coordinate 16 and a Y-coordinate 18. The outer lengths for both X axis and Y axis are both about 40 $\mu$m, and the thickness is about 5 $\mu$m. The dimension of the other L-shaped laser target 14 is similar to the laser target 12. The X-coordinate and the Y-coordinate for both laser targets 12 and 14, are pre-set before the process. Therefore, using a laser mending machine to scan and find the positions of the X-coordinate and the Y-coordinate, the relative address of the damaged circuit is defined, and the position of the damaged circuit 8 (as shown on FIG. 1a) can be found. The fuse of the damaged circuit is then blown by the laser mending machine, and a new circuit with the same function is disposed to enable the device to operate normally.

A rectangular diagram of a mending and testing method using a T-shaped laser target, and the T-shaped target, are shown as FIG. 2a and FIG. 2b.

Referring to FIG. 1a, on a wafer, the device 20 to be mended is found. Two sets of T-shaped laser target, are found (22 and 24 are the first set, 26 and 28 are the second set) on the device 20. Referring to FIG. 2b, an enlarged view of the T-shaped target set 22 and 24 is shown. The laser target 22 is a longitudinal bar with an X-coordinate 32, and the laser target 24 is a transverse bar with a Y-coordinate 34. The length and the width of the longitudinal bar shaped laser target 22 is 40 $\mu$m and 5 $\mu$m, respectively, whereas the length and the width of the transverse bar-shaped laser target 22 is 5 $\mu$m and 40 $\mu$m, respectively. The other target set of laser targets 26 and 28 is similar to the set 22 and 24. The X-coordinates and the Y-coordinates for both target sets 22 and 24, and 26 and 28 are pre-set before the process. Therefore, using a laser mending machine to scan and find the positions of X-coordinates and the Y coordinates, the relative address of the damaged circuit is defined, and the position of the damaged circuit 30 (as shown on FIG. 2a) can be found. The fuse of the damaged circuit is then blown by the laser mending machine, and a new circuit with the same function is disposed to enable the device to operate normally.

As the technique is improved, the space for devices becomes smaller. However, the dimension of the laser target to be recognised by a laser mending machine cannot be reduced, otherwise, misalignment and misjudgement are very likely to happen. The large space occupied by the laser target causes the circuit in the device to be very close to the laser target. The misalignment and misjudgement are again, very likely to happen. Therefore, the mending efficiency of the laser mending machine and the yield of the devices is degraded. On the other hand, if there is any mistake of the data of coordinate supplied by product engineers or design engineers, the mending effect is affected.

SUMMARY OF THE INVENTION

It is therefore an object of the invention to provide a mending method with a smaller space occupied by the laser target. Only one laser target is in use on each device in the method. Therefore, the space is reduced, and the circuit is not very close to the laser target. Consequently, the mending efficiency and the yield are improved.

Another object of the invention is to use the laser targets on the peripheral devices as reference targets to correctly obtain the relative coordinates of the position to be mended correctly.

To achieve these objects and advantages, and in accordance with the purpose of the invention, as embodied and broadly described herein, the invention is directed towards a method of mending and testing a semiconductor apparatus. The method comprises first providing a wafer with a plurality of devices formed thereon, each device having an L-shaped laser target formed on a same relative position. An L-shaped laser target is chosen as a primary laser target, and another L-shaped laser target on a neighboring device is chosen as a reference laser target. Using the primary laser target and the reference laser target, the wafer is scanned by a laser mending machine, and a damaged circuit is found. The damaged circuit is blown and replaced with a new circuit.

It is to be understood that both the foregoing general description and the following detailed description are exemplary and explanatory only and are not restrictive of the invention, as claimed.

DESCRIPTION OF THE PREFERRED EMBODIMENTS

Figure 1A:
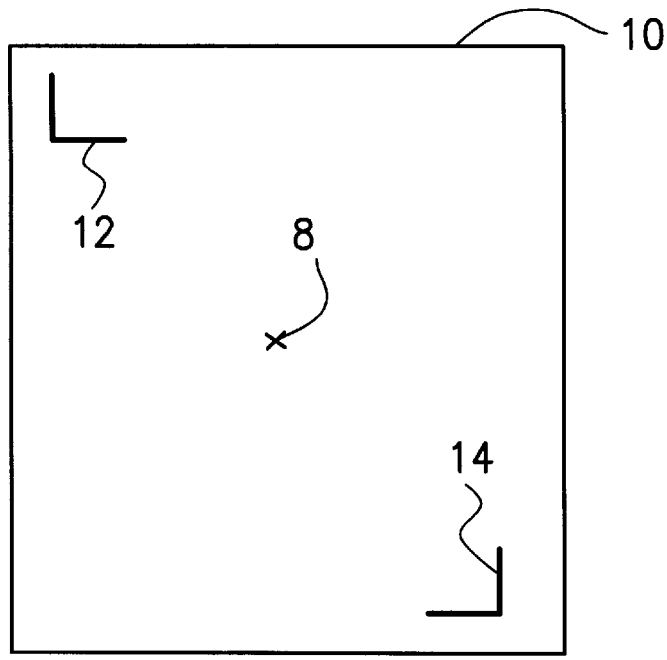
FIG. 1a and FIG. 1b are rectangular diagrams of a conventional mending method using L-shaped laser targets and the L-shaped laser targets.
Figure 1B:
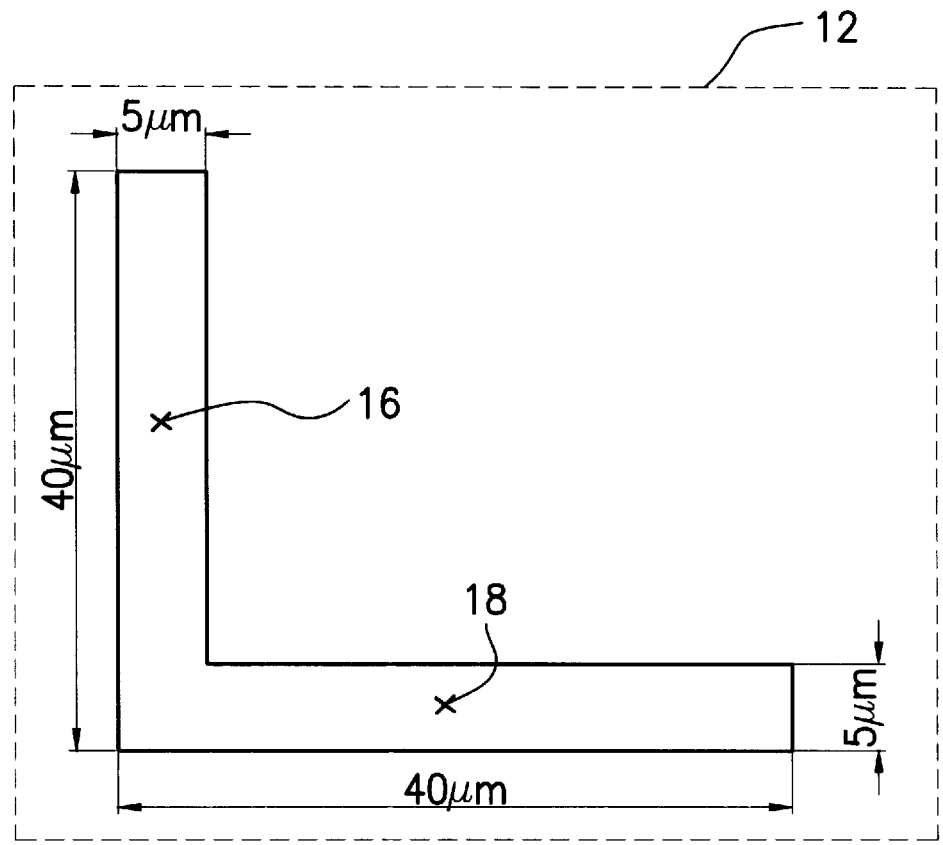
Figure 2A:
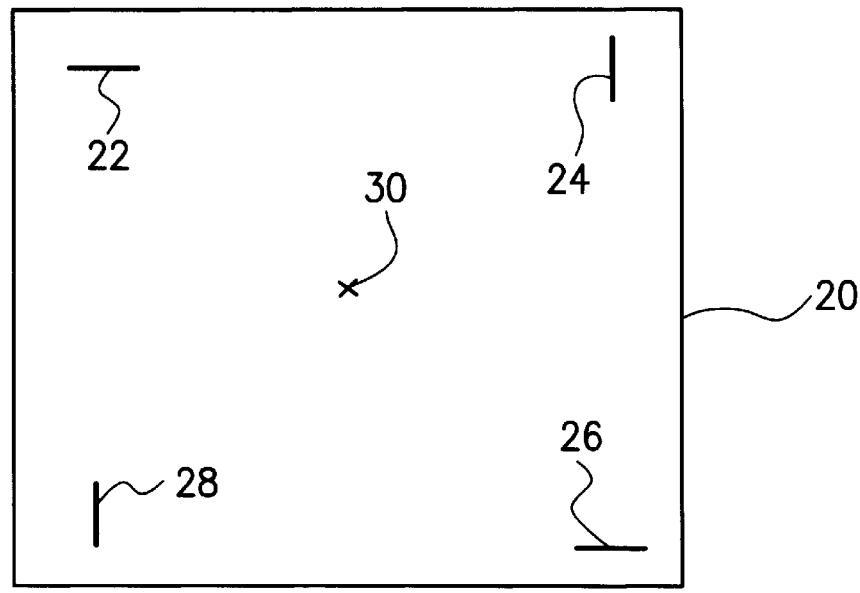
FIG. 2a and FIG. 2b are rectangular diagrams of a conventional mending method using T-shaped laser targets and the T-shaped laser targets.
Figure 2B:
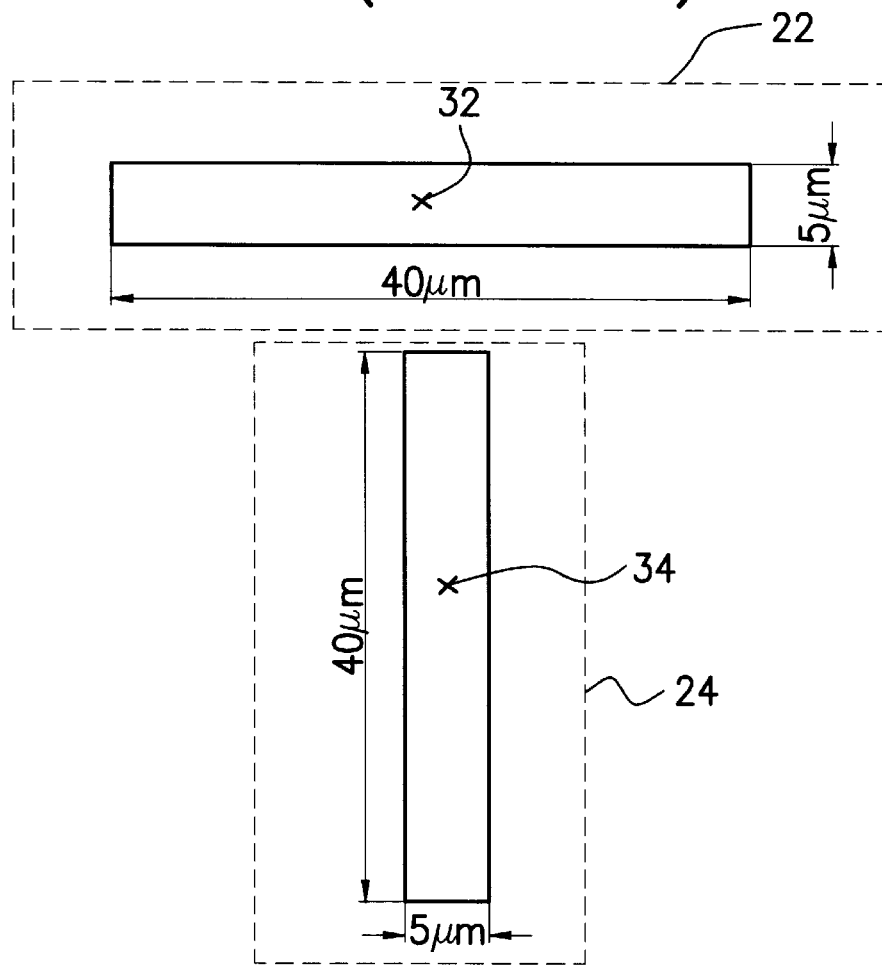
Figure 3:
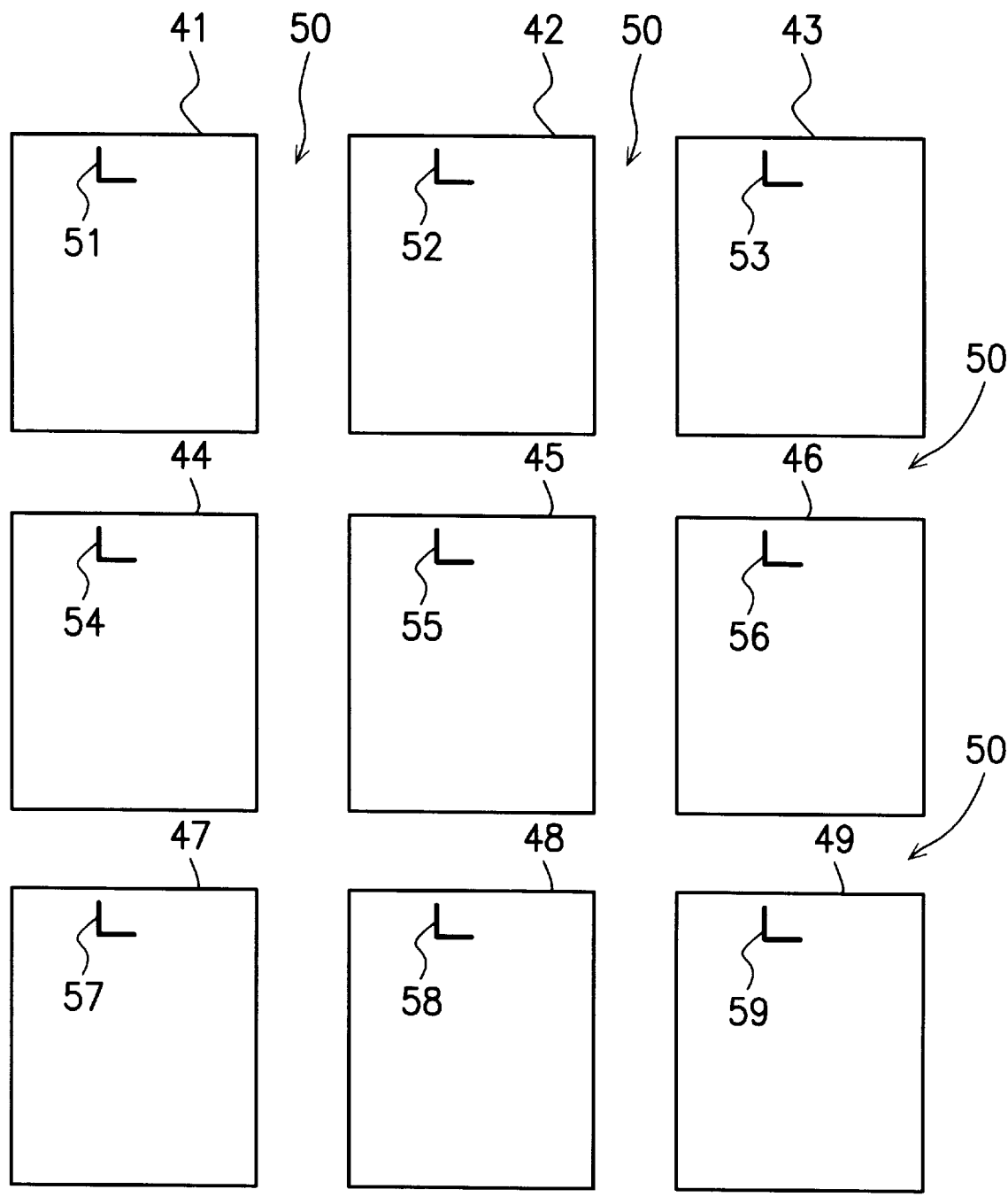
FIG. 3 shows a mending and testing method of semiconductor apparatus using L-shaped laser targets in a preferred embodiment according to the invention.

FIG. 3 shows a mending and testing method of semiconductor apparatus using L-shaped laser targets in a preferred embodiment according to the invention.

Referring to FIG. 3, nine neighbouring devices, including device 41 to device 49, formed by polysilicon on a wafer are shown. An L-shaped laser target 51 to 59, such as a metal target, is formed on each device 41 to 49, respectively. The laser targets 51 to 59 are located at the same relatively position on their corresponding devices 41 to 49. The same as the prior art, the length and the width of the laser target is 40 μm and 5 μm, respectively. There is an X-coordinate in the upper longitudinal part of each laser target, and a Y-coordinate in the lower transverse part of each laser target. In addition, these devices are isolated by a notch 50.

On the devices on the wafer, an L-shaped laser target of a device is chosen arbitrarily as a primary laser target. Normally, the L-shaped laser target on the device with a damaged circuit, such as the laser target 55 on the device 45, is set as a primary laser target. A laser target chosen from the other devices is set as a reference target. Normally, the device nearest to the primary laser target is chosen, for example, the laser target 56 on the device 46, or the laser target 58 on the device 48, is set as a reference target here.

The length and width of each device (41 to 49), and the dimension of the notch 50 are fixed. Moreover, each L-shaped laser target is located on the same relative position on its corresponding device. Therefore, the X-coordinate and the Y-coordinate of the reference target can be calculated with the data of length and width of the X-coordinate and Y-coordinate. For example, the X-coordinate and Y-coordinate of the primary set laser target 55 are (−200, 220) and (−180, 200) in μm, respectively. The horizontal distance between the reference target 56 and the primary target 55 is 1000 μm in the horizontal direction. Thus, the X-coordinate and Y-coordinate of the reference target 56 can be calculated as (−200+1000, 220)=(800,220) and (−180+1000, 200)=(820,200), respectively. Similarly, the X-coordinate and Y-coordinate of the reference target 58 is (−200, 220−1500)=(−200, −1280) and (−180, 200−1500)=(−180, −1300), respectively. If other laser targets on the rest of devices are chosen as reference targets, the X-coordinates and Y-coordinates can be calculated in a similar way.

By feeding the coordinates of the above primary and reference targets, the positions of these targets are determined after scanning by the laser mending machine. With feeding of the relative coordinates of these targets into the laser mending machine, the position to be mended, that is, the position with a damaged circuit, is obtained correctly. The fuse in the damaged circuit is then blown, and a new circuit with the same function is disposed.

Figure 4:
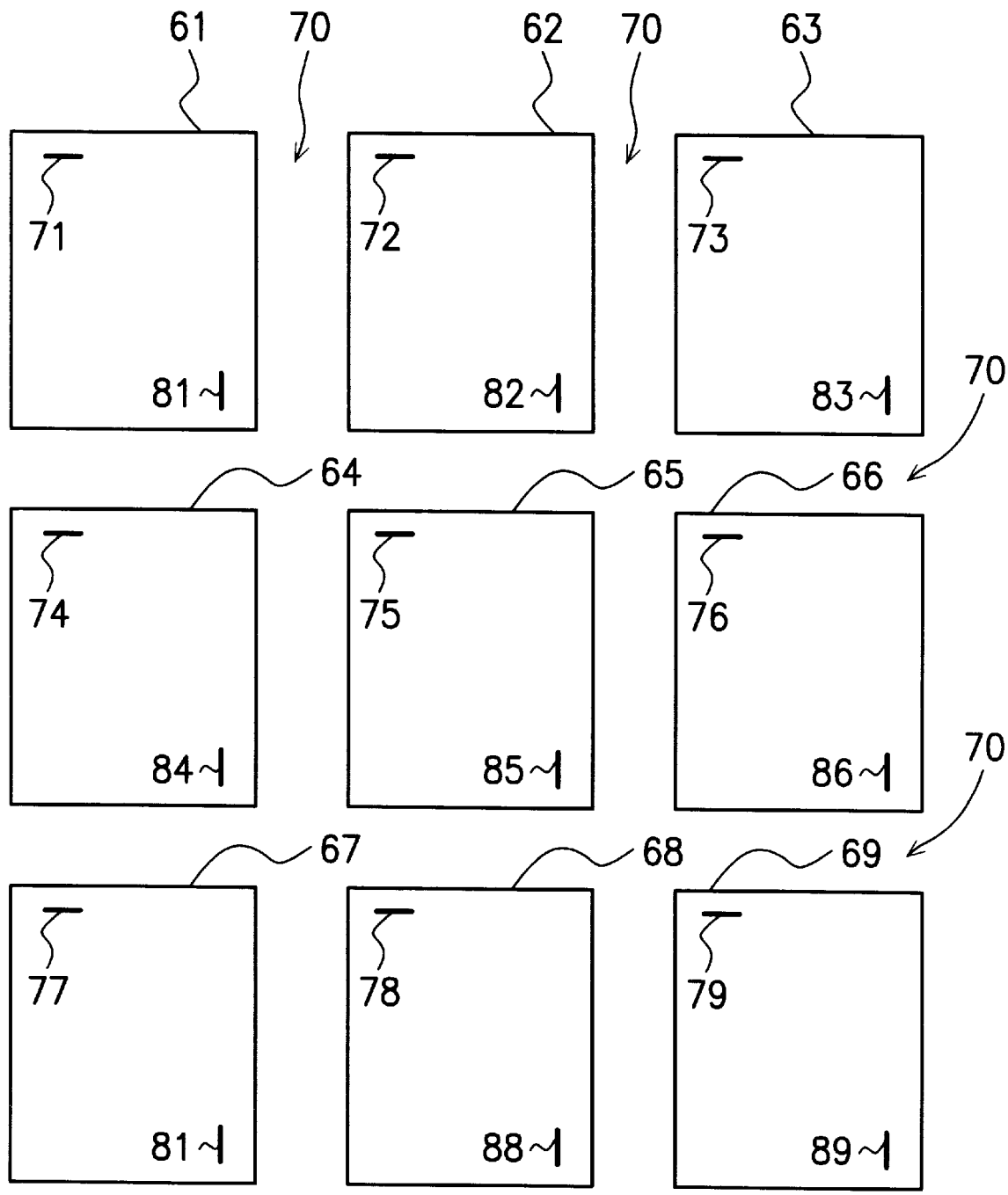
FIG. 4 shows a mending and testing method of semiconductor apparatus using T-shaped laser targets in a preferred embodiment according to the invention.

FIG. 4 shows a mending and testing method of semiconductor apparatus using T-shaped laser targets in a preferred embodiment according to the invention.

Referring to FIG. 4, nine neighbouring devices, including device 61 to device 69 formed by polysilicon on a wafer, are shown. A set of targets forming a T-shaped laser target, such as a set of metal targets, is formed on each device. Each T-shaped target includes one each of a respective longitudinal bar-shaped targets 71 to 79 and a respective one of transverse bar-shaped targets 81 to 89, provided on one of the devices 61 to 69. The laser targets 71 to 79 and 81 to 89 are located at the same relative positions on their corresponding devices 61 to 69. As in the previously-described art, the length and the width of the laser target is 40 μm and 5 μm, respectively. There is an X-coordinate on each longitudinal laser target, and a Y-coordinate on each transverse laser target. In addition, these devices are isolated by a notch 70.

On the devices on the wafer, a set of T-shaped laser targets of a device is chosen arbitrarily as a primary set of laser target. Normally, the target set on the device with a damaged circuit, such as the laser target 75 and 85 on the device 65, is set as a primary laser targets. A set of laser targets chosen from the other devices is set as a reference target set. Normally, the device nearest to the primary target set is chosen, for example, the laser target 76 and 86 on the device 66, or the laser target 78 and 88 on the device 68, is set as a reference target set here.

The length and width of each device (61 to 69), and the dimension of the notch 70 are fixed. Moreover, each T-shaped laser target is located on the same relative position on its corresponding device. Therefore, the X-coordinate and the Y-coordinate of the reference set of target can be calculated with the data of length and width of the X-coordinate and Y-coordinate. For example, the X-coordinate and Y-coordinate of the primary target set 75 and 85 are (−200, 220) and (−180, 200) in μm, respectively. The distance between the reference target set 76 and 86 and the primary target set 75 and 85 is 1000 82 m in the horizontal direction. Thus, the X-coordinate and the Y-coordinate of the reference target set 76 and 86 can be calculated as (−200+1000, 220)=(800,220) and (−180+1000, 200)=(820, 200). Similarly, the distance between the reference target set 78 and 88 and the primary target set 75 and 85 is about 1500 μm in the vertical direction. The X-coordinate and Y-coordinate of the reference target 78 and 88 is (−200, 220−1500)=(−200, −1280) and (−180, 200−1500)=(−180, −1300), respectively. If other laser targets on the rest of devices are chosen as reference targets, the X-coordinates and Y-coordinates can be calculated in a similar way.

By feeding the coordinates of the above primary and reference targets, the positions of these targets are scanned and calculated by the laser mending machine. With the feeding of the relative coordinates of these targets into the laser mending machine, the position to be mended, that is, the position with a damaged circuit, is obtained correctly. The fuse in the damaged circuit is then blown, and a new circuit with the same function is disposed.

Therefore, the characteristic of the invention is that only one laser target is in use for a device. The space occupied by the laser target is reduced without the shrinkage of the laser target it self Thus, the laser target is not too close to the circuit, and the misalignment and misjudgement made by a laser mending machine are reduced. Consequently, the mending efficiency and yield of the devices are enhanced.

Another characteristic of the invention is to use the laser targets on the peripheral devices as reference targets. Since the length and width are the same for each device on the wafer and the distance between every adjacent device is identical. Moreover, the relative position of each laser target on its corresponding device is the same. The precise relative coordinates can be calculated. Therefore, the accuracy of mending is enhanced.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of mending and testing a semiconductor apparatus, using a laser mending machine, comprising:
   providing a wafer with a plurality of devices formed thereon, each device having an L-shaped laser target on a same relative position;
   choosing an L-shaped laser target on one of the devices as a primary laser target;
   choosing another L-shaped laser target on another of the devices as a reference laser target;
   using the primary laser target and the reference laser target, scanning the wafer by the laser mending machine to find a damaged circuit on the wafer; and
   blowing the damaged circuit, and replacing the damaged circuit with a new circuit.

2. The method according to claim 1, wherein the devices are poly-silicon devices.

3. The method according to claim 1, wherein the devices are isolated by a notch.

4. The method according to claim 1, wherein the L-shaped laser targets are metal targets.

5. The method according to claim 1, wherein each of the L-shaped laser targets has an outer length of 40 µm, and a thickness of 5 µm.

6. The method according to claim 1, each of the L-shaped laser targets has an X-coordinate on its upper longitudinal part, and a Y-coordinate on its lower transverse part.

7. The method according to claim 1, wherein the primary laser target is chosen from the device with the damaged circuit.

8. The method according to claim 1, wherein the reference laser target is chosen from a device peripheral to the device with the primary laser target.

9. The method according to claim 6 wherein to find the damaged circuit, the X-coordinate and the Y-coordinate of the primary laser target, and the X-coordinate and the Y-coordinate of the reference laser target are used and scanned by the laser mending machine to obtain an address of the damaged circuit.

10. The method according to claim 1, wherein blowing the damaged circuit includes blowing a fuse therein.

11. A method of mending and testing a semiconductor apparatus, using a laser mending machine, comprising:
    providing a wafer with a plurality of devices formed thereon, each device having a set of targets forming a T-shaped laser target formed on a same relative position;
    choosing a first of the T-shaped laser targets on one of the devices as a primary laser target;
    choosing a second of the T-shaped laser targets on another one of the devices as a reference set of laser targets;
    using the primary laser target and the reference laser target, scanning the wafer by the laser mending machine to find a damaged circuit; and
    blowing the damaged circuit, and replacing the damaged circuit with a new circuit,
    wherein each of targets of the T-shaped laser targets comprises a longitudinal bar-shaped target, and a transverse bar-shaped laser target.

12. The method according to claim 11, wherein the devices are poly-silicon devices.

13. The method according to claim 11, wherein the devices are isolated by a notch.

14. The method according to claim 11, wherein the T-shaped laser targets are metal targets.

15. The method according to claim 11, wherein each of the longitudinal bar-shaped laser targets has a length of 40 µm, and a thickness of 5 µm.

16. The method according to claim 11, wherein each of the transverse bar-shaped laser targets has a length of 5 µm, and a thickness of 40 µm.

17. The method according to claim 11, each of the longitudinal bar-shaped laser targets has an X-coordinate, and each of the transverse bar-shaped laser targets has a Y-coordinate.

18. The method according to claim 11, wherein the primary set of laser targets is chosen from the device with the damaged circuit.

19. The method according to claim 11, wherein the reference set of laser targets is chosen from a device peripheral to the device with the primary set of laser target.

20. The method according to claim 17, wherein to find the damaged circuit, the X-coordinate and the Y-coordinate of the primary set of laser targets, and the X-coordinate and the Y-coordinate of the reference set of laser targets are used and scanned by the laser mending machine to obtain an address of the damaged circuit.

21. The method according to claim 11, wherein the blowing of the damaged circuit includes blowing a fuse therein.

22. A method of mending and testing a semiconductor apparatus, using a laser mending machine, comprising:
    providing a wafer with a plurality of devices formed thereon, each device having only one laser target on a same relative position thereof;
    choosing the laser target on a first of the devices as a primary laser target;
    choosing the laser target on a second of the devices neighboring the first of the devices as a reference laser target;
    using the primary laser target and the reference laser target, scanning the wafer with the laser mending machine, to find a damaged circuit on the wafer; and
    blowing the damaged circuit, and replacing the damaged circuit with a new circuit.

23. The method according to claim 21, wherein the laser targets comprise an L-shaped laser targets.

24. The method according to claim 21, wherein each laser target comprises a longitudinal bar-shaped target and a transverse bar-shaped target, together forming a T-shaped laser target.

25. The method according to claim 21, wherein each of the laser targets has an X-coordinate and a Y-coordinate.

26. The method according to claim 25, wherein the X-coordinate and the Y-coordinate of the primary laser target and the X-coordinate and the Y-coordinate of the reference laser target are used and scanned by the laser mending machine to obtain a location of the damaged circuit.

27. The method of claim 11, wherein on each target, the longitudinal bar-shaped target is spaced apart from the transverse bar-shaped target.

* * * * *